US006973101B1

(12) United States Patent
Grivna

(10) Patent No.: US 6,973,101 B1
(45) Date of Patent: Dec. 6, 2005

(54) N-WAY SIMULTANEOUS FRAMER FOR BIT-INTERLEAVED TIME DIVISION MULTIPLEXED (TDM) SERIAL BIT STREAMS

(75) Inventor: Edward L. Grivna, Brooklyn Park, MN (US)

(73) Assignee: Cypress Semiconductor Corp., San Jose, CA (US)

( * ) Notice: Subject to any disclaimer, the term of this patent is extended or adjusted under 35 U.S.C. 154(b) by 766 days.

(21) Appl. No.: 09/768,900

(22) Filed: Jan. 24, 2001

Related U.S. Application Data

(60) Provisional application No. 60/191,386, filed on Mar. 22, 2000.

(51) Int. Cl.$^7$ .............................. H04J 3/07
(52) U.S. Cl. ............... 370/510; 370/512; 365/230.08; 375/368
(58) Field of Search ............... 370/503, 506, 370/509, 510, 512, 513, 514, 515, 519; 375/354, 375/355, 364, 365, 368; 365/198, 230.06, 365/230.08, 23, 233; 711/156, 200, 202, 711/211, 219; 714/707, 789

(56) References Cited

U.S. PATENT DOCUMENTS

| 5,003,599 A | 3/1991 | Landry ..................... 380/48 |
| 5,010,559 A | 4/1991 | O'Connor et al. ......... 375/116 |
| 5,367,544 A | 11/1994 | Bruekheimer ............. 375/116 |
| 5,598,424 A | 1/1997 | Erickson et al. ............ 371/48 |
| 5,608,734 A | 3/1997 | Sandler et al. ............ 370/509 |
| 5,661,763 A | 8/1997 | Sands ..................... 375/368 |
| 5,666,547 A | 9/1997 | James et al. ............... 395/898 |
| 5,671,223 A | 9/1997 | Shachar et al. ........... 370/395 |
| 5,694,056 A | 12/1997 | Mahoney et al. ........... 326/38 |
| 5,790,607 A | 8/1998 | Burke et al. .............. 375/355 |
| 5,838,631 A | 11/1998 | Mick ...................... 365/233 |
| 5,854,794 A * | 12/1998 | Pawlowski ................ 370/509 |
| 5,960,007 A | 9/1999 | Grivna ..................... 370/509 |
| 5,982,786 A | 11/1999 | Grivna ..................... 370/503 |
| 6,079,001 A * | 6/2000 | Le et al. ................... 711/167 |
| 6,654,368 B1 * | 11/2003 | Smith et al. .............. 370/376 |

OTHER PUBLICATIONS

ITU-T, G.702, "Digital Hierarchy Bit Rates", 1984, amended 1988, pp. 1-4.

ITU-T, G.751, "Digital Multiplex Equipments Operating at the Third Order Bit Rate of 34 368 kbit/s and the Fourth Order Bit Rate of 139 264 kbit/s and using positive Justification", 1976, pp. 1-13.

ITU-T, G.704, "Synchronous Frame Structures Used at 1544, 6312, 2048, 8448 and 44 736 kbit/s Hierarchical Levels", 1984, amended 1988, revised in 1990, 1995 and 1998, pp. 1-37.

"An Experimental Pulse Code Modulation System for Short-Haul Trunks", By C.G. Davis, The Bell System Technical Journal, Jan. 1962, vol. XLI, No. 1, pp. 1-24.

"D2 Channel Bank: System Aspects", By H.H. Henning et al., The Bell System Technical Journal, Oct. 1972, vol. 51, No. 8, pp. 1641-1657.

(Continued)

*Primary Examiner*—Wellington Chin
*Assistant Examiner*—John Shew
(74) *Attorney, Agent, or Firm*—Christopher P. Maiorana, PC

(57) ABSTRACT

An apparatus comprising a memory, an encoder and one or more registers. The memory may be configured to (i) read and/or write a plurality of state vectors and (ii) read and/or write data. The encoder may be configured to present state vectors to be written in response to (i) data read from the memory (ii) a first address and (iii) a serial data stream. The registers may be configured to present the first address in response to an input address.

19 Claims, 4 Drawing Sheets

OTHER PUBLICATIONS

"Data Communication, A User's Guide", 3rd Edition, By Ken Sherman, pp. 361-370.
"Digital Telephony", Second Edition, By John Bellamy, pp. 110-119.
"Digital Telephony", Second Edition, By John Bellamy, pp. 180-217.
"Digital Telephony", Second Edition, By John Bellamy, pp. 334-359.
"Digital Transmission Systems", Second Edition, By David R. Smith, 1993, pp. -178-352.
"Fundamentals of Digital Switching", Second Edition, By John C. McDonald, 1990, pp. 285-322.
"A History of Engineering and Science in the Bell System Transmission Technology (1925-1975)", By E.F. O'Neill, 1985, pp. 527-607.
"Syntran-A New Direction for Digital Transmission Terminals", By G.R. Ritchie, Nov. 1985, IEEE Communications Magazine, vol. 23, No. 11, pp. 20-25.
"Institute of Electrical and Electronincs Engineers, 1973 International Conference on Communications", pp. 22-1 through 22-3.
"Institute of Electrical and Electronics Engineers, 1975 International Conference on Communications", vol. III, pp. 39-1 through 39-4.
"Introduction to Telephones & Telephone Systems", Second Edition, By A. Michael Noll, 1991, pp. 31-79.
"The McGraw-Hill Telecommunications Factbook", By Joseph A. Pecar et al., 1993, pp. 29-50.
"The Telephone an Historical Anthology", By George Shiers, 1977, pp. 358-363.
"Understanding Telephone Electronics", Third Edition, 1994, pp. 253-280.
"Computer Networks", Third Edition, By Andrew S. Tanenbaum, 1996, pp 1-813.
"Transmission Systems", By J.E. Flood et al., 1995, pp. 1-503.

* cited by examiner

N-WAY SIMULTANEOUS FRAMER FOR BIT-INTERLEAVED TIME DIVISION MULTIPLEXED (TDM) SERIAL BIT STREAMS

CROSS REFERENCE TO RELATED APPLICATIONS

The present application may relate to U.S. Pat. No. 5,982,786, issued Nov. 9, 1999 and U.S. Pat. No. 5,960,077, issued Sep. 28, 1999, which are each hereby incorporated by reference in their entirety.

This application claims the benefit of U.S. Provisional Application No. 60/191,386, filed Mar. 22, 2000 and is hereby incorporated by reference in its entirety.

FIELD OF THE INVENTION

The present invention relates to a method and/or architecture for an N-way simultaneous framer generally and, more particularly, to an N-way simultaneous framer for bit-interleaved time division multiplexed (TDM) serial bit streams or other similar bit streams.

BACKGROUND OF THE INVENTION

An existing approach is described in U.S. Pat. No. 5,666,547 by James, et al., which is hereby incorporated by reference in its entirety. James describes (i) the sequential capture of individual bits at specific intervals within a data stream, and (ii) the examination of those bits for a match condition with the framing pattern. At the first indication of a non-match, the capture of new bits is offset by one bit position in the data stream and the compare process repeats.

James also includes a process of capturing, but not examining, additional bits of the data stream. These additional bits are used to accelerate the framing process following a miscompare. Each time a bit is captured for testing, the immediately following bit is also captured and held in a buffer. In the event of a miscompare (and the resulting bit-slip), the next compare can be made only after one more bit is captured (i.e., following the delay of the bit-interleave period).

The design of James does not support any bit errors in the data stream, and can take a long time to acquire framing, even with the look-ahead captures (e.g., worst case is approximately 300,000 bits for the DS3 framer). More importantly, James also does not detect the presence of more than one framing sequence in the data stream which may exist naturally as part of the data being sent. Therefore, James allows a framing indication to be reported for an incorrectly framed data stream.

The telecommunications industry has changed almost entirely from communication by analog devices to digital signaling using serial bit-streams. To simultaneously support multiple data transfers and conversations through a single link, these data transfers and conversations are Time Division Multiplexed together. At the faster link speeds supported by SONET (e.g., Synchronous Optical NETwork) and SDH (e.g., Synchronous Digital Hierarchy) links, these data streams are byte-multiplexed together, along with byte-oriented framing information. Such byte-multiplexing and framing allows the data multiplexing and demultiplexing to always occur on character boundaries, slowing the required rate of processing for the associated serial bit-streams.

At slower speeds (e.g., DS0 at 64 kbps through DS3 at 44.736 Mbps) the source character streams are multiplexed together along with distributed bit-oriented framing information. In a 1.544 Mbps DS1 serial stream, twenty-four 64000 bps serial data streams are multiplexed together, along with an 8 kbps stream of framing bits. These framing bits are interspersed with the data stream and occur at a spacing of 193 bits. This means that a DS1 data stream sends 24 DS0 channels as an interleaved sequence of bytes and framing bits. These are combined into frames, with each frame comprising 192 bits (e.g., 24 bytes, one from each channel) of data followed by a single bit of the framing pattern. When sent as formatted for a D1 channel bank, this framing pattern comprises an alternating 1010 bit sequence. The D1 channel format is shown in FIG. 1 which shows three frames each comprising a 192-bit data field and a single framing bit marked as the letter "F".

Newer D2/D3 channel banks extend this 193-bit frame to a superframe comprising a modified sequence of 12 D1 frames. Such a superframe uses an alternating 1010 bit sequence in the frame bits located in the odd numbered frames, and 001110 in the even numbered frames. Framing to the superframe boundary is determined by detection of 100011011100 at the framing bit locations.

The D5 channel banks may use an extended superframe format of 24 D1 frames. The framing sequence comprises 001011 in every fourth frame (e.g., frames 4, 8, 12, 16, 20, and 24), with CRC and other signaling in the other framing bit locations.

In faster DS3 links, similar framing bits are inserted into the serial data stream to allow the multiplexed DS1 channels to be separated and delivered to their proper destinations. The DS3 frame is 4760 bits in length, and comprises seven subframes of 680 bits. Each subframe comprises eight blocks of 85 bits. Each block (e.g., within the subframe) starts with either a control bit or a framing bit. The odd numbered blocks all start with a control bit while the even numbered blocks all start with a framing bit. The framing bits are interleaved at a rate of one every 170 data bits, and generally comprise a repeating sequence of 1001, as shown in FIG. 2.

At the receive end of the link, it is necessary to determine the location of the framing bits to allow the twenty-four DS0 data streams (e.g., in a DS1 link) or 28 DS1 data streams (e.g., in a DS3 link) to be correctly separated (e.g., demultiplexed) and delivered to their proper destinations. This process generally involves searching the data stream for the bit pattern that is used as the framing delimiter. Because of the bit interleaving that occurs in these types of links, the framing bits are not contiguous, but are spread across all the data being delivered. Such a non-contiguous spread is shown in FIG. 1 for a DS1 data stream and FIG. 2 for a DS3 data stream.

Because the conventional approaches only conduct a single search, they are prone to mis-framing. Mis-framing occurs when the received bit stream contain patterns that match the framing bits at more than one offset. In addition, conventional approaches do not deal with bit errors in the data stream, which are expected to occur at approximately the required operating BER for the link.

SUMMARY OF THE INVENTION

The present invention concerns an apparatus comprising a memory, an encoder and one or more registers. The memory may be configured to (i) read and/or write a plurality of state vectors and (ii) read and/or write data. The encoder may be configured to present data to be written in response to (i) data read from the memory (ii) a first address and/or (iii) a serial data stream. The registers may be configured to present the first address in response to an input address.

The objects, features and advantages of the present invention include providing a method and/or architecture that may (i) locate a bit-interleaved serial framing sequence (or pattern) in a data stream; (ii) detect multiple instances of bit-offset locations meeting the requirements of the framing sequence, and withhold completion of framing until the multiple instances of bit-offset locations resolve to one; (iii) tolerate bit errors occurring within the framing sequence once framing has been achieved; (iv) frame within a worst case period of approximately N*I bits, where N is the number of bits required to indicate detection of a valid framing sequence, and I is the interleave depth of the framing bits within the referenced data stream (if no false-frame conditions exist); and/or (v) resolve a proper framing condition in the presence of false framing within two interleaves of the bit sequence upon resolution of the false-frame condition.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
FIG. 1 is a block diagram of a conventional data stream.
Figure 3:
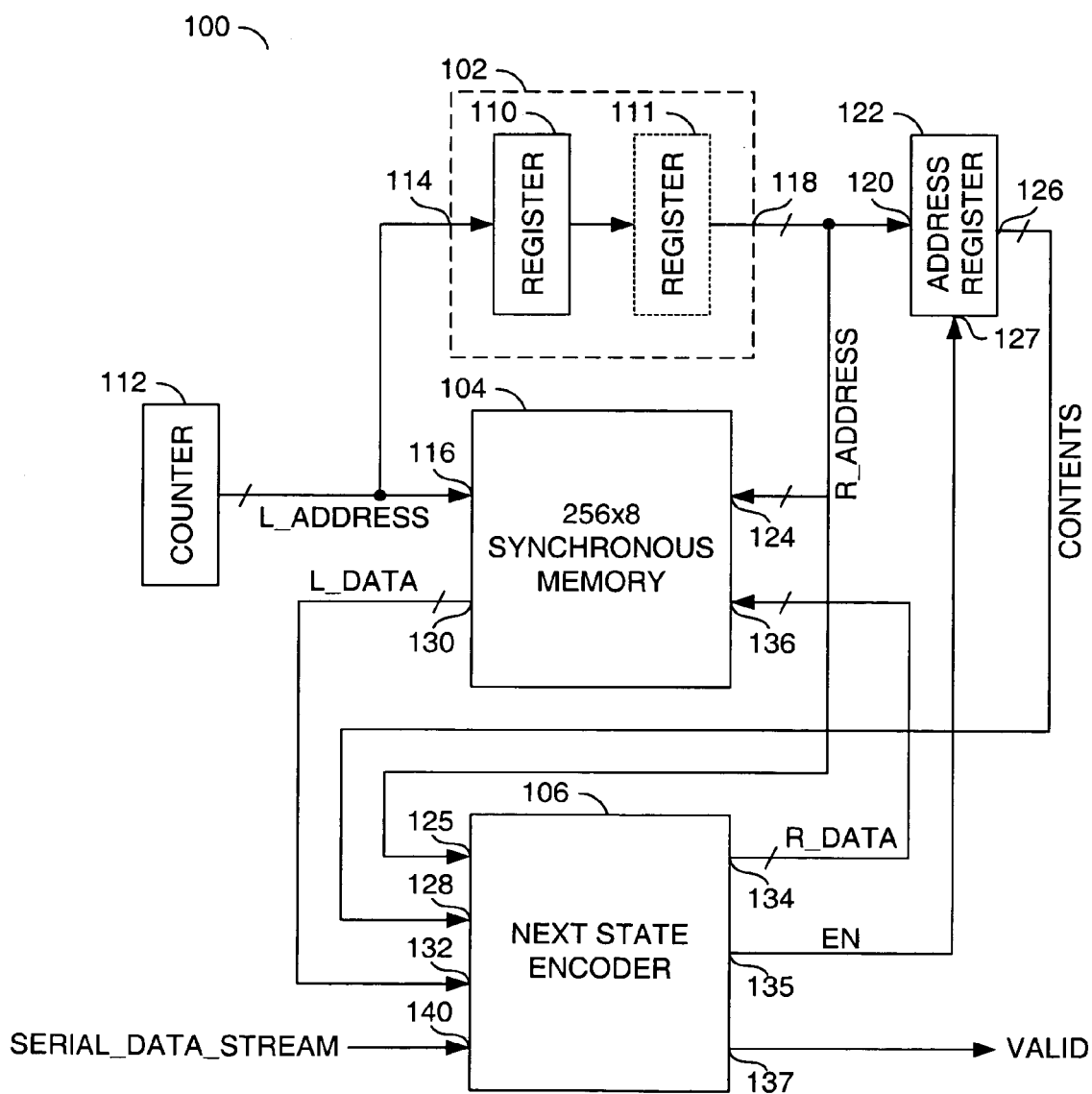
FIG. 3 is a block diagram of a preferred embodiment of the present invention.
Figure 2:
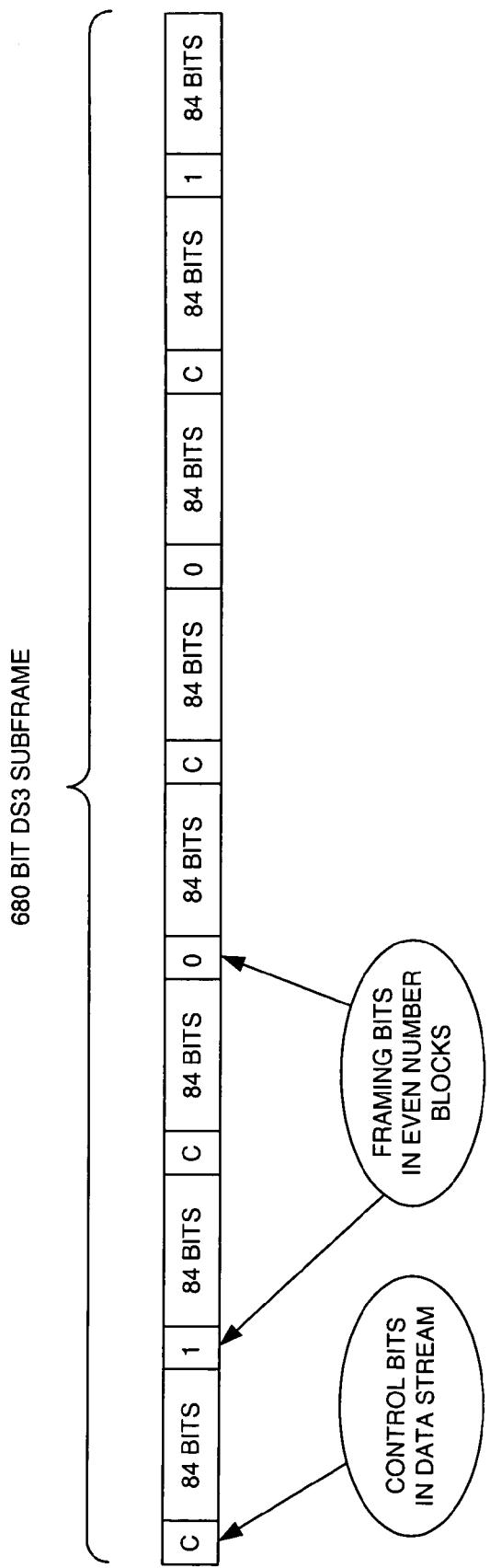
FIG. 2 is a block diagram of another conventional data stream.

Referring to FIG. 3, a block diagram of a circuit 100 is shown in accordance with a preferred embodiment of the present invention. The circuit 100 generally comprises a register section (or circuit) 102, a memory section (or circuit) 104 and a next state encoder section (or circuit) 106. The register section 102 may comprise a register 110 and a register 111.

In one example, the registers 110 and 111 may be implemented as pipeline registers. The register 111 may be implemented when the memory section 104 is configured for pipeline operation. The register 111 may not be implemented when the memory section 104 is configured for flow-through operation. Contents of the registers 110 and 111 may change on every clock cycle. The register 110 may capture a value of the address counter 112, which generally increments on every clock cycle. The register 111, if implemented, may capture a value stored in the register 110 on every clock cycle. The register section 102 may allow state information (e.g., one or more state vectors), previously read from one location in the memory section 104, to be written back to the same location. The memory section 104 may be implemented, in one example, as a synchronous dual port memory. In one example, the memory 104 may be a 256X8 dual port RAM. However, other memories may be implemented accordingly to meet the design criteria of a particular implementation.

A counter 112 may present a signal (e.g., L_ADDRESS) to an input 114 of the register section 102 and an input 116 of the memory 104. The register section 102 may have an output 118 that may present a signal (e.g., R_ADDRESS) to (i) an input 120 of an address register block (or circuit) 122, (ii) an input 124 of the memory 104, and (iii) an input 125 of the next state encoder 106. Additionally, the address register block 122 may have an input 127 that may receive a signal (e.g., EN). The address register block 122 may have an output 126 that may present a signal (e.g., CONTENTS) to an input 128 of the next state encoder 106. The signal EN may be implemented as, in one example, an enable signal. The address register block 122 may capture an address from the register section 102 in response to the signal EN. The control address may remain in the address register block 122 until (or unless) the framing sequence is detected at a different interleave in a data stream (to be discussed in connection with FIG. 4).

The memory 104 may have an output 130 that may present a signal (e.g., L_DATA) to an input 132 of the next state encoder 106. The signal L_DATA may be generated in response to the signal L_ADDRESS. The next state encoder 106 may also have an output 134 that may present a signal (e.g., R_DATA) to an input 136 of the memory 104, an output 135 that may present the signal EN and an output 137 that may present a signal (e.g., VALID). The next state encoder 106 may also have an input 140 that may receive a data (e.g., SERIAL_DATA_STREAM) stream.

The next state encoder 106 generally presents the signal R_DATA and the signal EN in response to the signal L_DATA, the data stream SERIAL_DATA_STREAM, the signal CONTENTS and the signal R_ADDRESS. In one example, the signal L_DATA may be presented to an input port 132 of the next state encoder 106. The output 134 of the next state encoder 106 may present the signal R_DATA. However, the signals L_DATA and R_DATA may be implemented as an appropriate type signal in order to meet the criteria of a particular implementation.

The circuit 100 may provide an apparatus that may search the data stream received at the input 140 and locate the bit-interleaved serial-framing sequence. The circuit 100 may provide an enhancement to conventional bit-multiplexed framers (such as the circuit of James discussed in the background section) that generally take a long time to locate the framing pattern because conventional bit-multiplexed framers may only search the data stream at one offset. The circuit 100 may simultaneously search all offsets.

The circuit 100 may be capable of simultaneous parsing of the bit-interleaved serial data stream at all offset locations. The circuit 100 may inhibit reporting of valid framing until a single bit-interleave position reports valid framing. Once valid framing has been achieved, the circuit 100 may handle intermittent errors in the framing pattern in the data stream SERIAL_DATA_STREAM, and may allow for fast reframing if or when the framing offset changes.

The circuit 100 may implement the memory section 104 comprising a number of addressable locations equivalent to or greater than the interleave depth. In one example, the circuit 100 may be an implementation for a DS3 serial stream. The DS3 serial stream may have an interleave depth of 170 bits, thus requiring the memory section 104 to comprise at least 170 addressable locations (state registers). The memory section 104 is generally implemented to comprise the required state registers. With a DS1 data stream, the requisite number of state registers would range from a minimum of 193 state registers for D1, D2, or D3 channel banks to a maximum of 772 state registers for the extended superframes in the newer D5 channel banks.

Since only one bit is active in the data stream SERIAL_DATA_STREAM at a time, only one state vector needs to be processed at a time, allowing these state vectors to be stored in the memory 104 instead of as separate registers. The memory 104 is generally configured as a dual-port memory, allowing a present state vector (e.g., the signal L_DATA) to be presented (along with the present bit of the data stream SERIAL_DATA_STREAM) to the next state encoder 106. The output of the next state encoder 106 may generate a new state vector (e.g., the signal R_DATA) based on the signal L_DATA and the value of the current bit of the data stream SERIAL_DATA_STREAM. Additionally, the new state vector may be generated in response to the contents of the address register 122 and the present address R_ADDRESS. The new state vector (R_DATA) may be stored during the following clock cycle, in the same location of the memory 104 that the state vector (L_DATA) was read from.

At each clock cycle, the signal L_ADDRESS for the left port of the memory 104 is advanced by one to point to the next memory location. The left port may be set, in one example, to read only. Incrementing the signal L_ADDRESS generally allows the next state vector (e.g., the vector associated with the present bit-interleave offset in the stream SERIAL_DATA_STREAM) to be read from the memory 104. As each new bit arrives in the stream SERIAL_DATA_STREAM, the state vector associated with that bit may be read from the memory 104. Such a progression generally continues until the address counter 112 reaches a maximum count. The addressable memory range may be fixed at a value equal to the interleave depth of the framing bits. The maximum count may be equal to N−1 (where N is an integer that may represent the total length of each interleave) if the address range starts at zero. After the maximum count, the counter 112 generally rolls over to the first address location of the memory 104.

Using an 8-bit state vector, 256 independent states may be identified in a state machine (to be described in connection with FIG. 4). Such an implementation may be more than enough to validate or invalidate the presence of the framing bit-sequence for any of the previously described channel mappings. The valid framing signal (e.g., VALID) may be a signal that indicates either that framing has been achieved, or that framing has not been achieved. For example, the signal VALID may be configured such that when TRUE, the machine 106 has located framing at one of the possible offset locations in the signal SERIAL_DATA_STREAM. When TRUE, the offset containing the framing bits is generally contained in the address register 122. When the signal VALID is false, framing has not yet been achieved, and the contents of the address register 122 may change on a per clock cycle basis.

When specifically used for DS3 framing, 8-bits of each state vector may be implemented to validate detection of the defined framing sequence. Such an example may allocate two bits (e.g., within each memory location) to track all necessary prior data bits (discussed later in connection with FIG. 4). An additional four bits may be implemented (i) to track the number of times the framing bit-sequence matched (e.g., when validating framing) or (ii) to detect an illegal framing bit (e.g., when already framed). The remaining two bits may be implemented to track as many as four states of framing information. When combined with additional state bits within the memory 104, or global state bits outside the memory, many more states are possible. A DS3 framer example implementation of the present invention will be described in the following paragraphs.

The register block 102 may be needed to transfer the read port address (L_ADDRESS) to the write port address (R_ADDRESS) of the memory 104. Such a transfer may be on the immediately following clock cycle to update the state vector for each bit-interleave with an associated new state vector. If the memory 104 is operated in a pipelined mode (instead of a fall through mode), the pipeline registers 110 and 111 may allow the next state vector to be written to the proper (e.g., same) location in the memory 104.

The address register block 122 may be implemented such that, if the framing sequence is detected, the offset of the framing bits in the stream SERIAL DATA STREAM is stored in the address register 122. The next state encoder 106 may be implemented to ensure that valid framing is not declared until a single data offset correctly reports detection of framing. The content of the address register 122 is generally updated whenever a framing condition is detected at one interleave and no other interleave has previously been validated as the valid framing offset. The output 118 (R_ADDRESS) of the register section 102 is generally compared with the contents of the address register 122 whenever a framing sequence is validated. If the address in the register section 102 does not match the present address (R_ADDRESS), then one or more additional offset locations generally also detected a framing sequence. Once the present address matches the address in the register 122, only one interleave may be valid and framing has generally been found.

Figure 4:
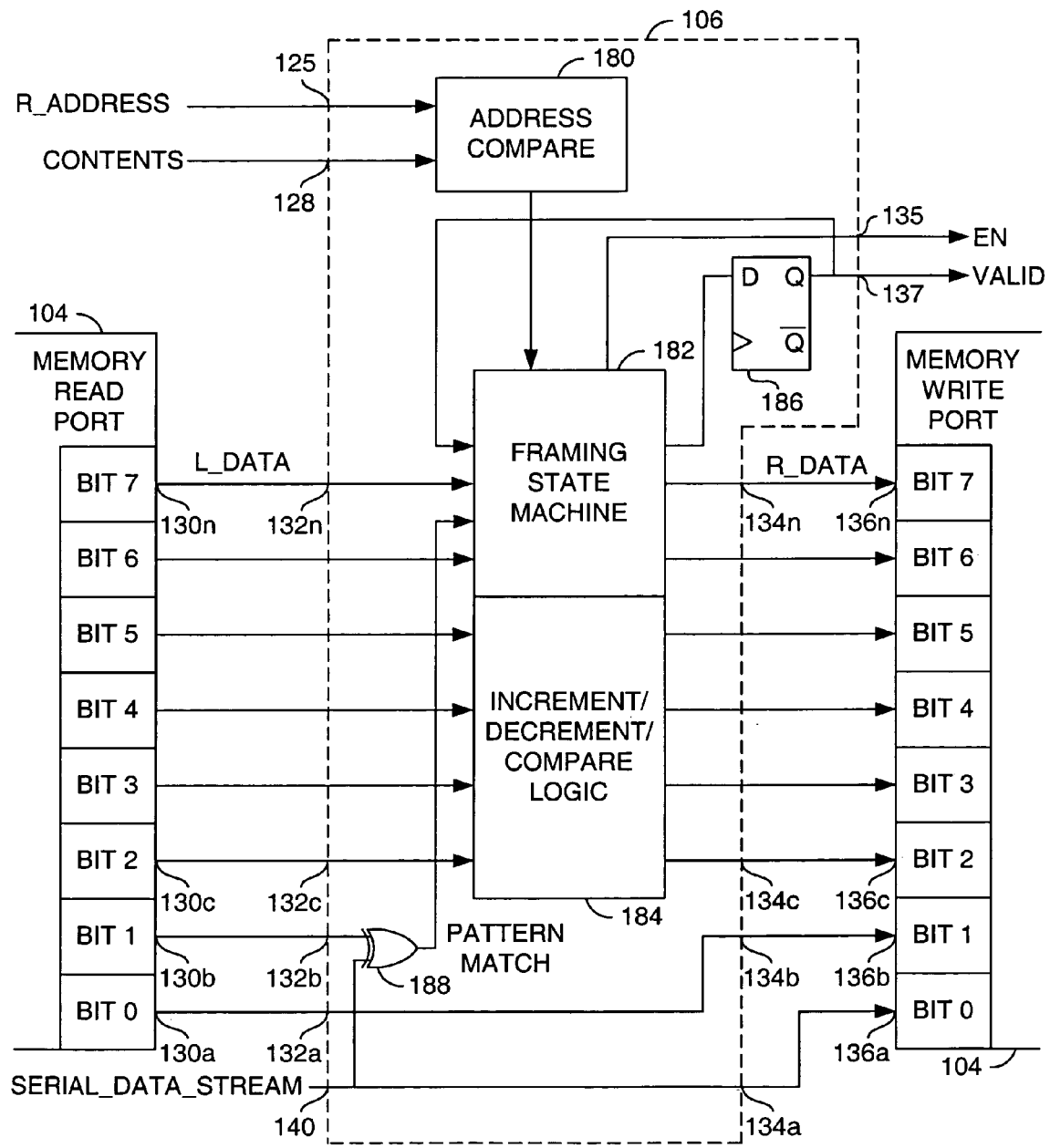
FIG. 4 is a block diagram of an encoder block of FIG. 3.

Referring to FIG. 4, an example of the next state encoder 106 is shown. The next state encoder 106 generally comprises an address compare block 180, a framing state machine 182, a compare logic block 184, a flip-flop 186 and one or more logic gate(s) 188. The logic gate(s) 188 may be implemented as, in one example, an XOR gate. However, the logic gate(s) 188 may be implemented as appropriate type logic gate(s) in order to meet the criteria of a particular implementation. Bit-0 of the signal L_DATA (as read from the output port 130a of memory 104), presented at the input 132a, is an output of one bit in the memory 104. Bit-0 of the signal R_DATA (as presented at the output 134a), is written to an input port 136a of the same bit in the memory 104. A read to the port 130 of memory 104 generally occurs in one clock cycle and presents the signal L_DATA as the present state vector. The new state vector (presented as the signal R_DATA) is generally written to the write port 136 of memory 104 on the immediately following clock cycle. On each read cycle, each of the bits (e.g., from the outputs 130a–130n) of the present state vector is read from the memory 104, and presented to the associated inputs (e.g., 132a–132n) of the encoder 106. On each write cycle, each of the bits (e.g., from the encoder outputs 134a–134n) is presented to the associated inputs (e.g., 136a–136n) of the memory 104 and written to the memory 104. Since reading and writing of the same location in the memory section 104 generally do not occur at the same time, it may be necessary to delay signal L_ADDRESS through the register section 102. The register section 102 may ensure that the data on the signal R_DATA is stored in the same location as the associated signal L_DATA was read from.

With reference to the example implementation described above, as each bit of the data sequence is received, the bit is passed to the least significant bit (LSB) of the next state encoder output (R_DATA) of the next state encoder. The LSB of the present state input to the next-state encoder (as read from the memory array 104) may be passed to the $2^1$ bit-position of the next state output of the next state encoder. The Bit-0 and Bit-1 of the present state may provide the history necessary to validate detection of a portion of the framing sequence.

In the DS3 data stream, a valid string of framing bits generally comprises a valid XOR of the present bit and the second previous framing bit. The framing bits may be used to develop the pattern match signal that may be implemented in the next state encoder 106.

Figure 5:
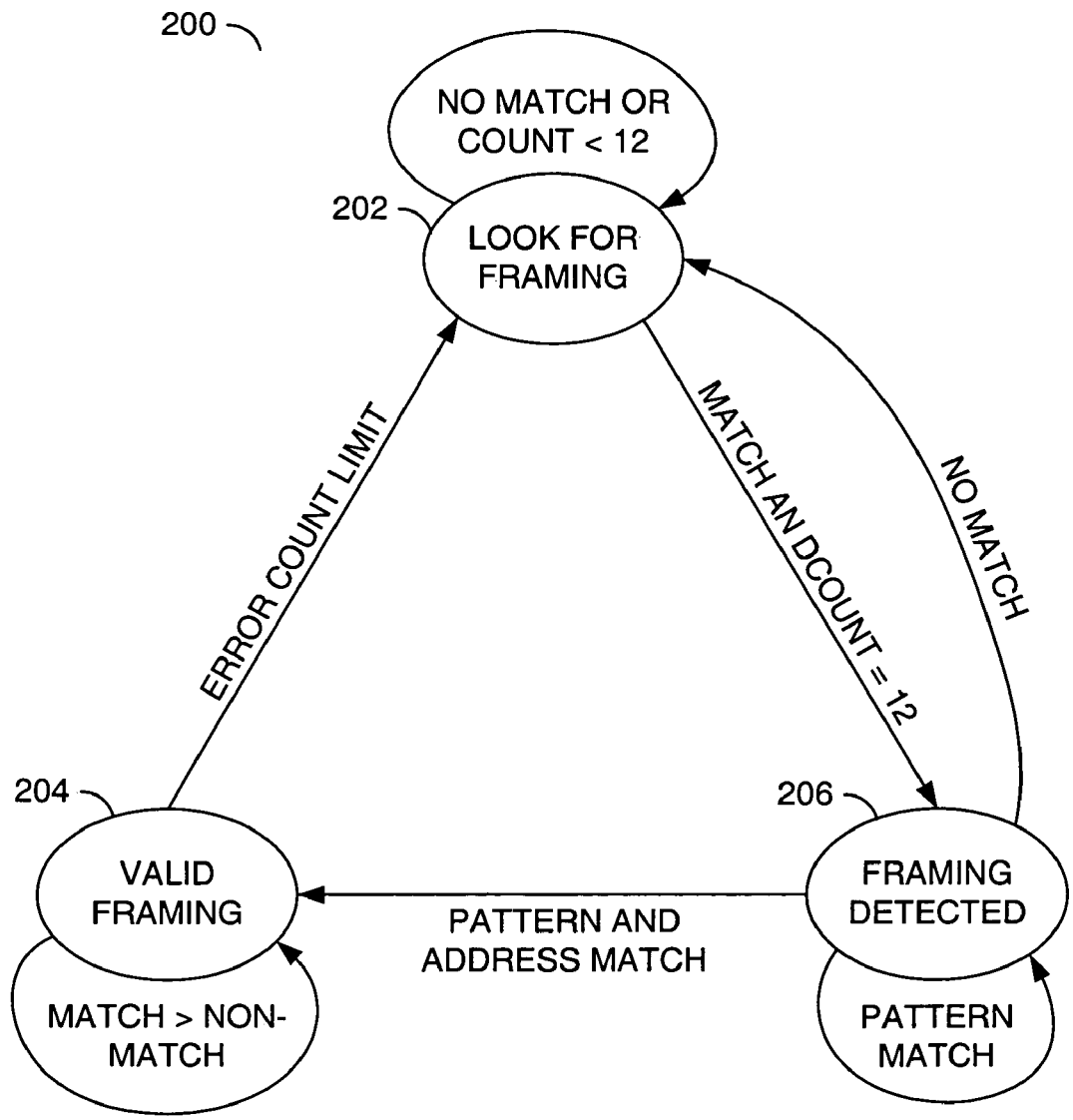
FIG. 5 is a state diagram illustrating an operation of the present invention.

Referring to FIG. 5, the framing state machine 182 within the next state encoder 106 may operate in three or more states. Three primary states are (i) look for framing 202, (ii) valid framing 204 and (iii) framing detected 206.

While the three states may be mapped into two bits in each state vector, the states are generally mapped across three bits. Two bits are generally implemented within each state vector stored within the memory 104, while one global bit may be used outside the memory 104 (e.g., as part of the next state encoder 106) to indicate the valid framing (e.g., the signal VALID) condition to the remaining state vectors in the next state encoder 106.

The look for framing state 202 is generally where pattern match conditions are looked for first. Upon detection of a pattern match at an offset location, the incrementer 184 may increase the count bits by one to track the number of pattern matches at that offset location. If a non-match is detected, the count bits are generally cleared and the state machine 200 may remain in the look for framing state 202. If the count bits reach a specific value (e.g., normally 12 for DS3 data streams), the state machine 200 generally moves to the framing detected state 206.

In the framing detected state 206, the state machine 200 may continue to monitor the data stream (SERIAL_DATA_STREAM) for both valid and invalid pattern match conditions. Detection of a pattern match generally allows the state vector for the particular interleave to remain in the framing detected state 206. Detection of a non-match condition generally causes an immediate return to the look for framing state 202 and clears the count bits.

When entering or remaining in the framing detected state 206, if the global valid framing bit (from the flip-flop 186) in the next state encoder 106 does not indicate valid framing, the address of the present interleave may be captured in the address register 122. When in the framing detected state 206, the present value of the address register 122 may be compared (address compare 180) with the present address (R_ADDRESS). If the addresses match (and a pattern match remains present), the state vector may be changed to the global valid framing state 204 and the valid framing bit (from the flip-flop 186) in the next state encoder 106 is generally also set.

If more than one interleave is in the framing detected state at the same time, the address register 122 may be overwritten with new address as each interleave is processed. Overwriting the address in the address register 122 may prevent declaration of the valid framing state 204 until only one interleave reports valid framing.

When in the valid framing state 204, the state machine 200 may continue to monitor pattern match conditions. The count bit field may be used to track both pattern match and non-match conditions. Upon first entry to the valid framing state 204, the count bits are generally pre-loaded to an all "1" condition (e.g., the value MAXIMUM_COUNT). Whenever a pattern match is detected, the count bits may be incremented. If the count bits are already at the value MAXIMUM_COUNT, then the bits remain at that value. If a non-match is detected, the count may be decremented by 1. If the count field reaches a predefined value, the state machine 200 may revert to the look for framing state 202 and the valid framing bit in the next state encoder 106 is generally cleared. In one example, to provide maximum sensitivity to errors, the predefined value may be set to the value MAXIMUM_COUNT-1. Such an example may cause a loss of framing upon the first detected bit error within the framing bits.

There are numerous alternative implementations of the present invention that may primarily focus on alternate constructions of the memory 104 and how the state machine vector generation may be performed.

The memory 104 may be implemented in at least four different forms. The example of a true DPRAM has been previously discussed. In another example, it may be possible to perform a read-modify-write access in a standard SRAM. Such an access generally requires twice the bandwidth per port as a true dual-port, but is generally achievable at true DS3 (e.g., 45 MHZ) clock rates. A third example may be to operate with two banks of standard RAM. One bank may be accessed for sequential read operations. The other bank may be accessed for sequential write operations. At the point that the address counter 112 rolls over, the banks may be switched to allow the bank that was just written to be the source of data for the next set of read operations. Another example may be to implement a FIFO having a character depth of at least that of the interleave depth, and a character width of at least that of the normal state vector, plus one more bit serving as an interleave boundary marker.

The next-state encoder hardware may be implemented in a number of ways. For framing patterns of greater complexity, it may be necessary to capture a history much longer than two bits, or to encode that history as alternate states in the state machine 200. Such an implementation may require extending the width of each state vector to more than 8-bits, which may necessitate a wider memory 104. Alternate (e.g., non-DS3) source data streams may also require different maximum address depth for the memory 104, depending on the depth of the bit interleaving and the complexity of the framing pattern.

Instead of having the framing state, count bits, and history implemented as separate fields of the state vector, the framing state, count bits and history may also be implemented as independent states of the state machine 200. While such an implementation would probably generate a state machine 200 with fewer overall possible states than the possible states of the combined circuitry of the framing state machine 182, compare logic 184, and history bits (of the previously described next state encoder 106), the implementation may be more difficult to encode and maintain. The additional states generated may make the gate constructs implemented by the state machine 200 more complex, which may, in turn, slow the overall operation.

The pipeline registers 110 and/or 111 may be implemented to pass the read address (L_ADDRESS) to the write address port (R_ADDRESS) and may also be implemented as a simple decrementer or subtractor. The write address (R_ADDRESS) is generally maintained as one less than the read address (or two less when the memory 104 is configured for pipeline access instead of fall-through access). Alternately, two separate counters may be implemented. One counter is generally configured as a master while the other counter may operate as a slave with a start state controlled by the master.

The present invention may detect framing within the SERIAL_DATA_STREAM within both a minimum and a maximum of 12 interleaves of data (e.g., 2040 bits, the minimum required to indicate valid framing) if only one interleave data contents match the framing data. While conventional approaches may also have a similar minimum framing interval, the maximum for conventional approaches generally exceeds 300,000 bits under the same conditions. By comparison, the present invention may constitute an improvement in the worst case operation by a factor of approximately 150.

In addition, the conventional approach may report valid framing (e.g., the signal VALID) if the framing sequence is detected at an interleave position that is part of the data field. Since the data field content may be uncontrolled, framing sequence detection at an interleave position that is part of the data field is quite possible. The present invention may withhold indication of framing until only one of all possible interleave positions is reporting framing detected.

Upon detection of a loss of framing, conventional approaches may be required to start the search process from scratch. Conventional approaches may have the same minimum and maximum framing intervals as previously described. The present invention, when moving from one valid framed state to a new valid framed state having a different offset, may perform the search process within a minimum of one interleave period (e.g., 170 bits for DS3 data streams) because the state machine 200 may continue to track all possible interleave positions for valid framing, even when one interleave has already been declared to be the location of valid framing.

Conventional approaches (as referenced in James) also make no provisions for the handling of bit errors within the data stream once framing had been detected. For normal bit error rates found on telecommunications equipment, a trip point of MAXIMUM_COUNT-2 or MAXIMUM_COUNT-3 may allow the machine to remain framed in the presence of the normal (yet random) bit errors that exist in these links.

The present invention may provide the ability to detect multiple instances of bit-offset locations meeting the requirements of the framing sequence and to withhold completion of framing until these instances resolve to one.

The present invention may tolerate bit errors occurring within the framing sequence once framing has been achieved. The present invention may also provide the ability to frame within a maximum worst case period of approximately N*I bits (2040 bits), where N is an integer representing the number of bits required to indicate detection of a valid framing sequence, and I is an integer representing the interleave depth of the framing bits within the referenced data stream (if no false-frame conditions exist). The present invention may also provide the ability to resolve a proper framing condition in the presence of false framing within two interleaves of the bit sequence (e.g., 340 bits) upon resolution of the false-frame condition.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:
   a memory configured to (i) read and/or write a plurality of state vectors and (ii) read and/or write data;
   an encoder configured to present state vectors to be written in response to (i) data read from said memory, (ii) a first address and (iii) a serial data stream; and
   one or more registers configured to present said first address in response to an input address, wherein said apparatus is configured to retain framing in the presence of bit errors and provide a reframe condition following a loss of framing that occurs in less than two frames.

2. The apparatus according to claim 1, further comprising a counter circuit configured to generate said input address.

3. The apparatus according to claim 2, wherein said encoder further comprises:
   a state machine configured to (i) a monitor for one or more pattern match conditions, (ii) continue to monitor said serial stream for both valid and invalid pattern match conditions, and (iii) continue to monitor for said pattern match conditions and implement a count bit field to track said pattern match conditions and one or more non-match conditions;
   a compare circuit configured to (i) control said state machine and (ii) compare said register address and a second address; and
   a gate configured to control said state machine in response to a bit of said data read and said serial data stream.

4. The apparatus according to claim 3, wherein said state machine comprises:
   a first logic section configured to increase a value representing the number of sequential bits found that match a framing pattern; and
   a second logic section configured to determine if an incrementer is tracking one or more framing sequence matches or mismatches, and if framing has been validated.

5. The apparatus according to claim 4, wherein said apparatus is further configured to postpone indication of valid framing until a single framing match is present.

6. The apparatus according to claim 5, wherein said apparatus is further configured to frame within approximately N×I bits, where N is an integer representing a number of bits required to indicate detection of a valid framing sequence and I is an integer representing an interleave depth.

7. The apparatus according to claim 6, wherein said apparatus is configured to (i) detect one or more bit-offset locations meeting the requirements of the framing sequence, and (ii) withhold completion of framing until one or more bit offset locations resolve to a single offset location.

8. The apparatus according to claim 3, wherein said state machine is configured to simultaneously validate framing at all possible locations in a serial stream.

9. The apparatus according to claim 1, wherein said memory comprises a synchronous DPRAM.

10. The apparatus according to claim 1, wherein said memory comprises a SRAM with read-modify-write access.

11. The apparatus according to claim 1, wherein said memory comprises two banks of standard RAM, wherein a first bank is accessed for sequential read operational and a second bank is accessed for sequential write operations.

12. The apparatus according to claim 1, wherein said memory comprises a FIFO having a character depth of at least that of an interleave depth and a character width of at least that of a normal state vector, plus one more bit serving as an interleave boundary marker.

13. The apparatus according to claim 1, further comprising an address register configured to store said first address and present a second address.

14. A method for detection of framing in a bit interleaved data stream, comprising the steps of:
   (A) reading and/or writing a plurality of state vectors;
   (B) presenting data to be written in response to (i) data read, (ii) a first address and (iii) a serial data stream; and (C) presenting said first address in response to an input address, wherein said method retains framing in the presence of bit errors and provides a reframe condition following a loss of framing that occurs in less than two frames.

15. The method according to claim 14, wherein said method simultaneously validates framing at all possible locations in said serial data streams.

16. The method according to claim 14, wherein said method postpones indication of valid framing until a single framing match is present.

17. The method according to claim 14, wherein said method allows a reframe following loss of framing to occur in less than two frames.

18. An apparatus comprising:
   means for storing a plurality of state vectors;
   means for presenting state vectors to be written in response to (i) data read, (ii) a first address and (iii) a serial data stream; and
   means for presenting said first address in response to an input address, wherein said apparatus retains framing in the presence of bit errors and provides a reframe condition following a loss of framing that occurs in less than two frames.

19. A method for detection of framing in a bit interleaved data stream, comprising the steps of:
   (A) reading and/or writing a plurality of state vectors;
   (B) presenting data to be written in response to (i) data read, (ii) a first address and (iii) a serial data stream; and
   (C) presenting said first address in response to an input address, wherein said method (i) simultaneously validates framing at all possible locations in said serial data stream and (ii) allows a reframe following loss of framing to occur in less than two frames.

* * * * *